United States Patent [19]

Hirabayashi et al.

[11] Patent Number: 5,234,849
[45] Date of Patent: Aug. 10, 1993

[54] METHOD OF PREPARING A HIGH ELECTRON MOBILITY FIELD EFFECT TRANSISTOR

[75] Inventors: Takayuki Hirabayashi; Mikio Kamada, both of Tokyo, Japan

[73] Assignee: Sony Corporation, Tokyo, Japan

[21] Appl. No.: 883,178

[22] Filed: May 15, 1992

[30] Foreign Application Priority Data

May 17, 1991 [JP] Japan ............................ 3-140722

[51] Int. Cl.$^5$ ................... H01L 21/265; H01L 21/44
[52] U.S. Cl. .......................................... 437/40; 437/203
[58] Field of Search ...................... 437/40, 41, 203; 257/776

[56] References Cited

U.S. PATENT DOCUMENTS 4,965,646  10/1990  Ipri et al. .................... 257/776
5,053,348  10/1991  Mishra et al. .................. 437/40

FOREIGN PATENT DOCUMENTS 276269  12/1986  Japan .
65677   3/1988   Japan .

Primary Examiner—Brian E. Hearn
Assistant Examiner—Linda J. Fleck
Attorney, Agent, or Firm—Lewis H. Eslinger; Jay H. Maioli

[57] ABSTRACT

A high electron mobility field effect transistor (HEMT) inhibiting generation of leakage current otherwise caused by contact of a gate metallization layer with a channel layer, in which a GaInAs layer acting as a channel layer and an n-AlInAs layer acting as an electron supplying layer are stacked on a semi-insulating InP wafer with an AlInAs layer acting as a buffer layer in-between to form an island-shaped region, contact between the lateral wall surface of the island-shaped region and the gate metallization layer is to be inhibited. Specifically, the gate metallization layer is Schottky-connected in a planar state on a gate-forming surface provided by the upper surface of the n-AlInAs layer and is formed with an elevation overlying the gate-forming surface from the outer end of the gate-forming surface to outside. This elevation may be formed by forming a dummy gate on the island-shaped region for providing an elevated pseudo gate-forming surface, setting a sidewall so as to be raised to a higher level than an actual gate-forming surface on the lateral wall surfaces of the dummy gate and the island-shaped region, removing the dummy gate and depositing the gate metallization layer on the sidewall. The sidewall is ultimately removed to leave a void below the elevation. In this manner, the gate metallization layer becomes an air-bridged structure and the leakage current in the gate electrode is reduced while the gate parasitic capacity is diminished.

2 Claims, 4 Drawing Sheets

METHOD OF PREPARING A HIGH ELECTRON MOBILITY FIELD EFFECT TRANSISTOR

BACKGROUND OF THE INVENTION

1. Field of the Invention

This invention relates to a high electron mobility field effect transistor and a method for preparation thereof.

2. Description of the Prior Art

In the high electron mobility field effect transistor, referred to hereinafter as HEMT, prepared from a compound semiconductor, such as GaAs, a channel layer and a carrier supplying layer (electron supplying layer) having a band gap width larger than that of the channel layer, are stacked on a wafer, and an electron flowing region occupied by a two-dimensional electron gas is formed in a hetero interface region. The field effect transistor usually has its active region patterned to the shape of an island called mesa and separated by a step difference from the remaining region.

Meanwhile, an AlInAs/GaInAs based HEMT including a AlInAs layer and a GaInAs layer formed on an InP wafer, as disclosed for example in JP Patent KOKOKU Publication No. 2-62945 (1990), has been proposed to taken the place of the proven HEMT employing a GaAs wafer. In an active region of this HEMT, the GaInAs layer acts as channel layer, while the AlInAs layer, stacked thereon, acts as an electron-supplying layer. With such transistor, an electron mobility higher than that with the GaAs/AlGaAs based HEMT may be achieved because of the smaller effective mass of electrons in the GaInAs layer. In such HEMT, the gate electrode is Schottky-connected to the AlInAs layer as the electron supplying layer. Specifically, the gate electrode is formed by vacuum deposition of alloys of Au, Ge or Ni. The source-drain electrodes are connected to the GaInAs layer acting as the channel layer by ohmic connection. More specifically, these electrodes are formed by depositing Pt, Al or W silicides by vacuum deposition or sputtering.

In the above-described HEMT in which the electron supplying layer and the channel layer are deposited in the form of an island, since the gate metallization layer is deposited for being extended on the lateral wall surface of the island-shaped region for providing a gate electrode leadout region, the gate metallization layer is contacted with the exposed surface of the channel layer. With the GaAs/AlGaAs based HEMT, in which the gate metallization layer is formed of an Au-Ti alloy, since the Schottky barrier between the gate metallization layer and the channel layer is as high as about 0.8 eV, the leakage current at the gate electrode presents no serious problem. However, with the HEMT in which the AlInAs layer and the GaInAs layer are stacked to form an island-shaped region, the Schottky barrier between the gate metallization layer and the GaInAs channel layer assumes a lower value of about 0.3 eV. The result is that the leakage current is generated between the gate metallization layer and the channel layer to deteriorate the transistor characteristics.

For overcoming the problem of leakage current, it may be contemplated to provide a sidewall on the lateral wall surface of the island-shaped region to inhibit contact between the gate metallization layer and the channel layer.

It is now assumed that, as shown for example in FIG. 1, an AlInAs layer 2 as a buffer layer is deposited on a semi-insulating InP substrate 1, a GaInAs layer 3 as a channel layer and an n-AlInAs layer 4, as an electron-supplying layer, doped with n-type impurities, are sequentially stacked on this buffer layer, these layers 3, 4 being processed into an island-shaped region 5 for defining an active region 5. An upper surface of the island-shaped region 5 is a gate-forming surface 5a. A sidewall 7 is formed on a lateral wall surface 6 of the island-shaped region 5. The sidewall 7 is formed by etching back a layer of a dielectric material coating at least the island-shaped region 5. However, the etchback end point can be determined only with difficultly such that overetching may be produced depending on the region formed on the wafer so that the upper end face of the sidewall 7 is receded from the gate forming surface 5a. If a gate metallization layer 8 is formed on such wafer, the gate metallization layer 8 tends to creep down on the lateral wall surface 6 in an amount corresponding to the regression of the sidewall 7. Thus it is difficult to stably reduce the leakage current at all times.

OBJECT AND SUMMARY OF THE INVENTION

In view of the above depicted status of the art, it is an object of the present invention to provide a HEMT capable of reliably reducing the leakage current between the gate metallization layer and a channel layer, and a method for preparation thereof.

The present invention provides a high electron mobility field effect transistor in which a channel layer and a carrier supplying layer having a band gap width larger than that of said channel layer are sequentially stacked on a substrate for forming an island-shaped region, wherein a gate metallization layer connected to said island-shaped region on the upper surface of said island-shaped region is raised to a level higher than said upper surface from an end of said island-shaped region towards the outside of said end in a manner to separate the lateral wall surface of said island-shaped region from said gate metallization layer.

For raising a part of the gate metallization layer at the outer end of the island-shaped region, a dummy gate is first formed on the island-shaped region for setting an apparent gate-forming surface so as to be higher in level than the actual gate-forming surface, and a sidewall raised to a higher level than the actual gate-forming surface is formed on the lateral wall surfaces of the island-shaped region and the dummy gate. The gate metallization layer is finally deposited removing the dummy gate. With the gate metallization layer thus raised to a higher level at the outer end of the island-shaped region, the lateral wall surface of the island-shaped region is spaced apart a large distance from the gate electrode.

In this manner, the gate electrode is not contacted directly with the lateral wall surface of the island-shaped region to prevent generation of the leakage current.

DETAILED DESCRIPTION OF THE INVENTION

Figure 1:
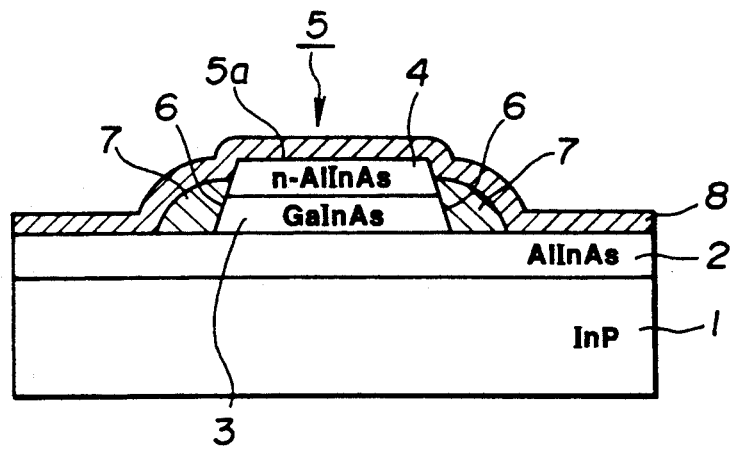
FIG. 1 is a schematic cross-sectional view showing an illustrative construction of a conventional HEMT provided with a sidewall and particularly showing a gate electrode and the vicinity thereof for explanation of a problem inherent in the conventional HEMT.

Referring to the drawings, the present invention will be explained in detail.

Figure 2:
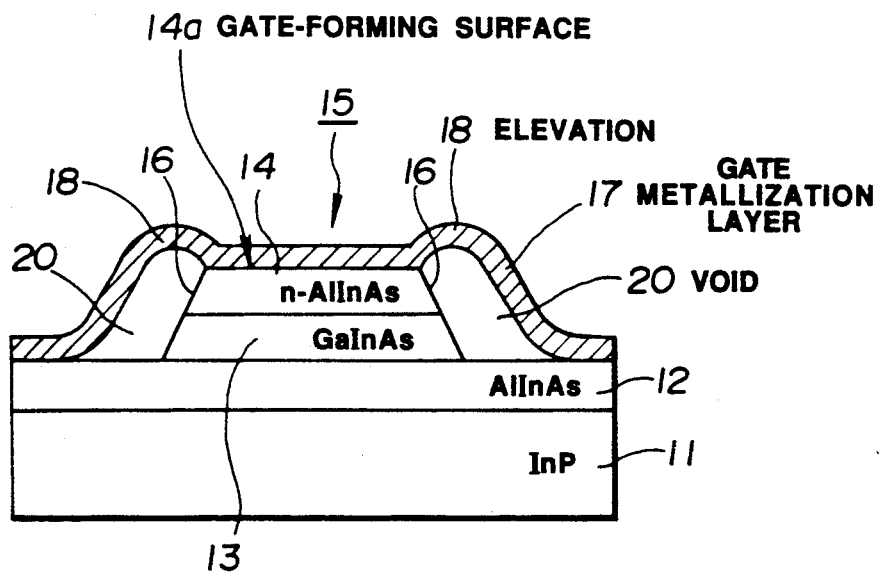
FIG. 2 is a schematic cross-sectional view showing an illustrative construction of a HEMT according to the present invention and particularly showing a gate electrode and the vicinity thereof.

FIG. 2 shows the cross-section of a gate and a nearby portion of a HEMT embodying the present invention. On an InP substrate 11, an AlInAs layer 12, not containing impurities, as a non-doped buffer layer, a GaInAs layer 13 and a n-AlInAs layer 14 are stacked in this order. The GaInAs layer 13 is used as a channel layer and a two-dimensional electron gas layer is formed at a hetero-interface between the layer 13 and the n-AlInAs layer 14. The GaInAs layer 13 is a non-doped layer and stacked by an epitaxial growth technique, such as MOCVD. The n-AlInAs layer 14 functions as an electron supplying layer and has a band gap wider than that of the GaInAs layer 13. The n-AlInAs layer 14 is doped with n-type impurities, such as Si, and is formed by an epitaxial growth technique, such as MOCVD.

The GaInAs layer 13 and the n-AlInAs layer 14 are formed by etching as an island-shaped region 15. The island-shaped region 15 has an inclined lateral wall surface 16 so that the GaInAs layer 13 and the n-AlInAs layer 14 present a substantially trapezoidal cross-section in a direction perpendicular to the gate length. The upper surface of the n-AlInAs layer 14 is a planar gate-forming surface 14a on which a gate metallization layer 17 is to be deposited. The gate metallization layer 17 is deposited for extending from one to the other ends of the gate-forming surface 14a.

The gate metallization layer 17 is an electrode for controlling the electron flow depending on the voltage applied thereto and is formed with an elevation portion 18 positioned above the gate-forming surface 14a. The gate electrode 17 is gradually elevated from the gate forming surface 14a to the elevation portion 18 and thence extended downwardly with a moderate inclination as far as the surface of the AlInAs layer 12 functioning as the buffer layer. The gate metallization layer 17 is formed by patterning an alloy film formed by evaporation on the overall wafer surface.

Beneath the elevation portion 18 of the gate metallization layer 17, a void 20 is defined between the metallization layer 17 and the lateral wall surface 16 of the island-shaped region 15. The void 20 is formed by removing deformed sidewall section 22b, shown in FIG. 8, as will be explained subsequently. Thus the gate metallization layer 17 assumes a so-called air-bridged structure. By means of the void 20, the gate metallization layer 17 is not contacted directly with the GaInAs layer 13 functioning as the channel layer. This leads to reduction of the leakage current and the gate parasitic capacity.

The process for the preparation of the above-mentioned HEMT is hereinafter explained by referring to FIGS. 3 to 9.

Figure 3:
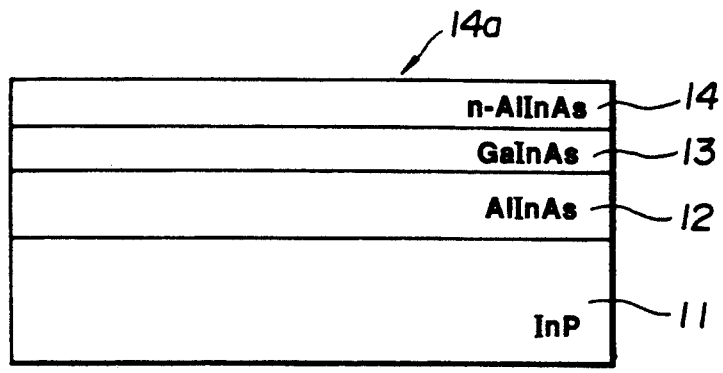
FIG. 3 is a schematic cross-sectional view showing a state in the course of preparation of the HEMT of the present invention in which respective compound semiconductor layers have been formed by an epitaxial growth technique.

Referring first to FIG. 3, the non-doped AlInAs layer 12, the non-doped GaInAs layer 13 and the n-AlInAs layer 14 are stacked on the InP substrate 11 by epitaxial growth technique. The non-doped AlInAs layer 12 and the non-doped GaInAs layer 13 function as the buffer layer and as the channel layer, respectively. A two-dimensional electron gas layer is formed in the vicinity of a hetero-interface between the GaInAs layer 13 and the AlInAs layer 14. This n-AlInAs layer 14 is used as an electron supplying layer and has its surface defining the gate-forming surface 14a.

Figure 4:
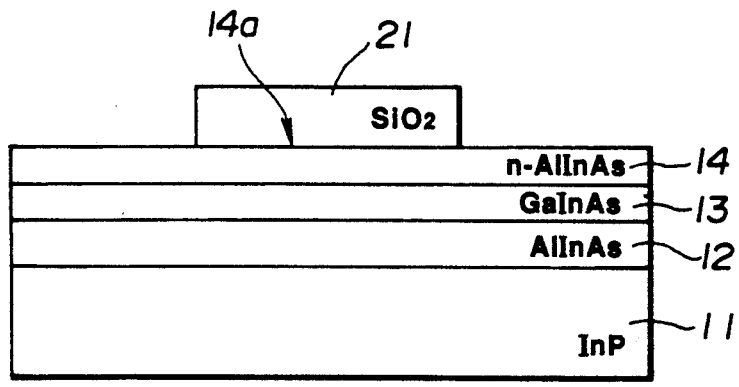
FIG. 4 is a schematic cross-sectional view showing the state in the course of preparation of the HEMT of the present invention in which an insulating film functioning as a dummy gate has been produced by patterning.

Then, using the technique of lithography and the reactive ion etching (RIE) technique, an $SiO_2$ insulating film 21 was formed by patterning on the surface of the n-AlInAs layer 14, as shown in FIG. 4. This insulating film 21 is used as a dummy gate and formed for covering the island-shaped region 15 which is to be formed by subsequent etching. The insulating film 21 may also be formed of silicon nitride, instead of $SiO_2$.

Figure 5:
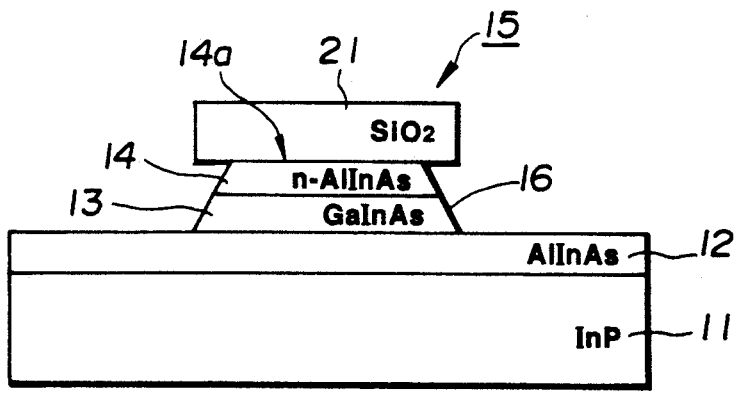
FIG. 5 is a schematic cross-sectional view showing the state in the course of the preparation of the HEMT according to the present invention in which an island-shaped region has been produced by etching.

Then, using the insulating film 21 as a mask, the n-AlInAs layer 14 and the GaInAs layer 13 were etched to form the island-shaped region 15, as shown in FIG. 5. During this etching, undercuts were formed below the insulating layer 21, so that the lateral wall surface 16 of the island-shaped region 15 was inclined slightly.

Figure 6:
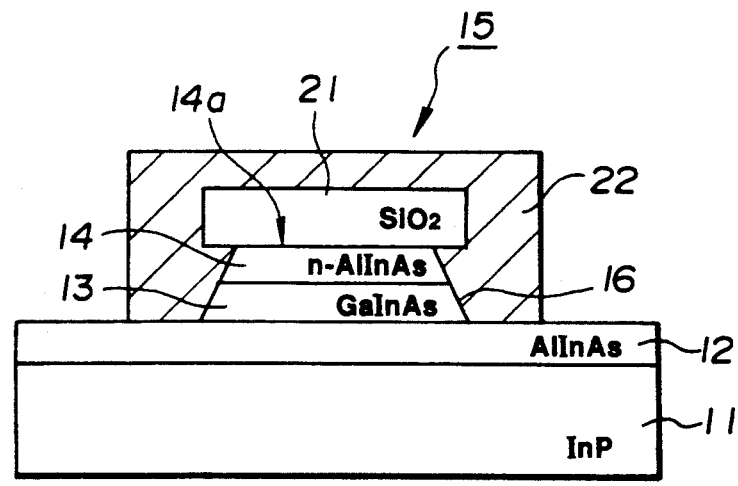
FIG. 6 is a schematic cross-sectional view showing the state in the course of the preparation of the HEMT of the present invention in which a photoresist layer has been produced for covering the island-shaped region and the insulating film.

A photoresist material was then coated to a larger thickness on the overall wafer surface to form a photoresist coating completely covering the island-shaped region 15 and the insulating film 21. Selective exposure to light and development were then performed so that a photoresist layer 22 was left as shown in FIG. 6. The lateral wall surface of the photoresist layer 15 was set so as to be outside of the lateral wall surface 16 of the island-shaped region 15.

Figure 7:
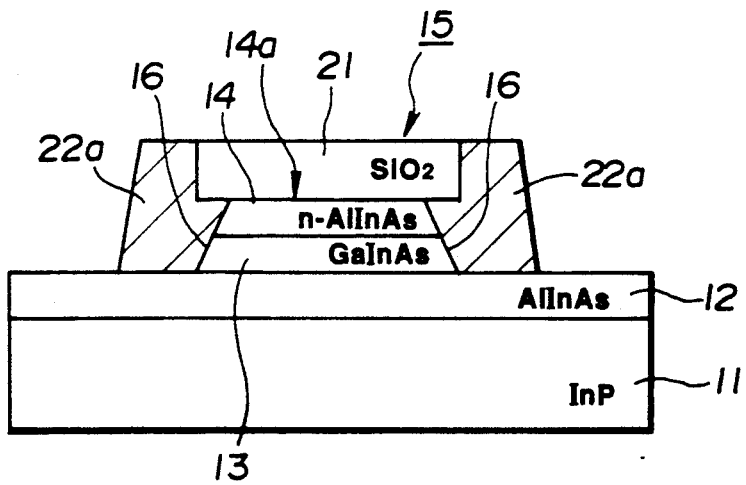
FIG. 7 is a schematic cross-sectional view showing the state in the course of the preparation of the HEMT according to the present invention in which the photoresist layer is etched back until the insulating film is exposed to form a sidewall.

The photoresist layer 22 was then etched back until the upper surface of the insulting film 21 was exposed, as shown in FIG. 7. IN this manner, a sidewall 22a was formed on the lateral wall sections of the insulting film 21 and the island-shaped region 15.

The insulating film 21 then removed for exposing the gate-forming surface 14a which is the upper surface of the n-AlInAs layer 14. Since the insulating film 21 functioned as a dummy gate, the upper most part of the sidewall 22a was above the exposed gate-forming surface 14a.

Figure 8:
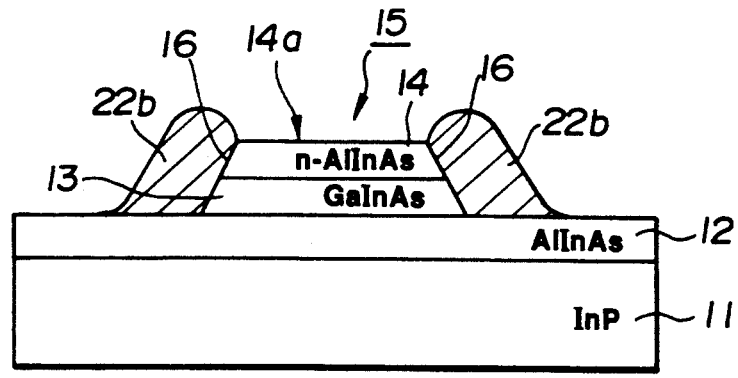
FIG. 8 is a schematic cross-sectional view showing the state in the course of the preparation of the HEMT of the present invention in which the insulating film has been removed and the sidewall has been deformed by baking.

The wafer was then processed with baking so that the upper most part of the sidewall 22a was rounded a reflow effect to form the deformed sidewall 22b as shown in FIG. 8. This deformed sidewall 22b was raised gradually from the end of the gate-forming surface 14a and gradually lowered towards the surface of the AlInAs layer 12 to substantially follow the tilt of the lateral wall surface 16, that is, substantially parallel to the lateral wall surface 16.

Figure 9:
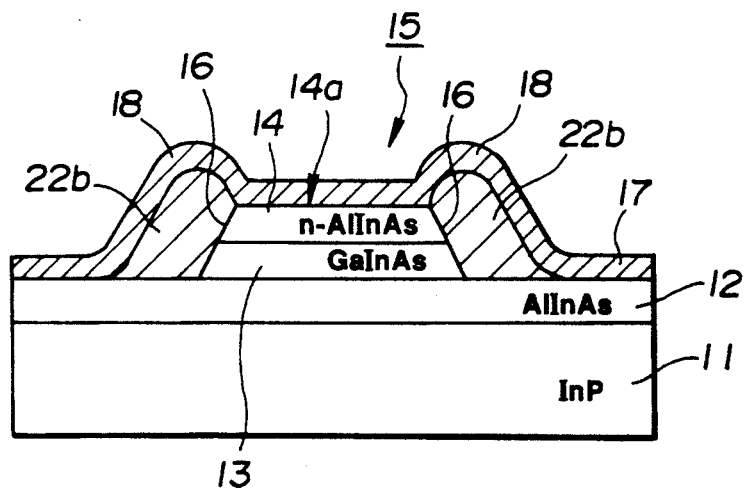
FIG. 9 is a schematic cross-sectional view showing the state in which a gate metallization layer has been produced in the course of the preparation of the HEMT of the present invention in which the gate metallization layer has been produced.

The gate metallization layer 17 was then deposited on the overall wafer surface, as shown in FIG. 9. Since the deformed sidewall 22b was formed at this time on the lateral wall surface 16 of the island-shaped region 15 so as to be at a higher level than the gate-forming 14a, the gate metallization layer 17 was formed with the elevation 18 raised to a level higher than the gate-forming surface 14a. The gate metallization layer 17 was not interrupted because the deformed sidewall 22b was rounded at the upper most part by baking.

The gate metallization layer was then patterned by a lift- off method. The deformed sidewall 22b was removed simultaneously so that the void 20 was formed in the region so far occupied by the deformed sidewall 22b, as shown in FIG. 2. Since the void 20 has now been formed below the elevation 18 of the gate metallization layer 17, there was no risk of the gate metallization layer 17 creeping down to the lateral wall surface. 16 of the island-shaped region 15 to reduce the leakage current. Also, with the deformed sidewall 22b thus removed, the gate metallization layer 18 is of the so-called air-bridged structure to diminish the gate parasitic capacity.

Although the photoresist material is used in the above-described embodiment as a material of the deformed sidewall 22b for forming the elevation 18 in a part of the gate metallization layer, the photoresist material may also be replaced by other organic materials, insulting films or reflow films. The present invention is also not limited to the above-described AlInAs/GaInAs based HEMT, but may extensively be applied to HEMT employing stacked layers of other compound semiconductors.

What is claimed is:

1. A method for producing a high electron mobility field effect transistor comprising the steps of
    forming an island-shaped region by sequentially stacking a channel layer and a carrier supplying layer having a larger band gap width than that of said channel layer,
    forming, on the lateral wall surface of said island-shaped region, a sidewall raised to a level higher than the upper surface of said island-shaped region, wherein said sidewall is formed by coating said island-shaped region and a pattern of an insulating film selectively formed thereon with a resist pattern, etching back the resist pattern until said insulting film is exposed, and carrying out heat treatment after removal of said insulating film, and
    forming a gate metallization layer covering said island shaped layer and said sidewall, wherein patterning said gate metallization layer removes said sidewall, whereby the lateral wall surface of said island-shaped layer and the gate metallization layer are separated from each other by a void.

2. A method for producing a high electron mobility field effect transistor as claimed in claim 1 wherein said substrate is formed by stacking an AlInAs layer on a semi-insulated InP wafer, forming said channel layer with GaInAs and forming said carrier supplying layer with doped AlInAs.

* * * * *